United States Patent
Shigeta et al.

(10) Patent No.: US 9,188,873 B2
(45) Date of Patent: Nov. 17, 2015

(54) SUBSTRATE HAVING ETCHING MASK AND METHOD FOR PRODUCING SAME

(75) Inventors: Kaku Shigeta, Chiba (JP); Shintaro Sugawara, Chiba (JP); Tatsuo Shigeta, Chiba (JP)

(73) Assignee: THINK LABORATORY CO., LTD., Chiba (JP)

( * ) Notice: Subject to any disclaimer, the term of this patent is extended or adjusted under 35 U.S.C. 154(b) by 0 days.

(21) Appl. No.: 13/980,695

(22) PCT Filed: Feb. 8, 2012

(86) PCT No.: PCT/JP2012/052859
§ 371 (c)(1),
(2), (4) Date: Sep. 5, 2013

(87) PCT Pub. No.: WO2012/108464
PCT Pub. Date: Aug. 16, 2012

(65) Prior Publication Data
US 2013/0337231 A1    Dec. 19, 2013

(30) Foreign Application Priority Data
Feb. 10, 2011   (JP) ................ 2011-026688

(51) Int. Cl.
*B81C 1/00*  (2006.01)
*G03F 7/40*  (2006.01)
(Continued)

(52) U.S. Cl.
CPC ............. *G03F 7/40* (2013.01); *H01L 21/033* (2013.01); *H05K 3/061* (2013.01); *H05K 2201/0323* (2013.01); *Y10T 428/24479* (2015.01)

(58) Field of Classification Search
CPC ........... G03F 7/40; G03F 5/20; H01L 21/033; H01L 21/0337; H05K 3/061; H05K 2201/0323; H05K 3/0073; H05K 3/0079; Y10T 428/24479; B41C 1/18
USPC ......... 430/323, 324, 329, 307; 216/41, 49, 51
See application file for complete search history.

(56) References Cited

U.S. PATENT DOCUMENTS 6,673,684 B1 *   1/2004   Huang et al. .................. 438/299
2003/0215749 A1   11/2003   Kato et al.

FOREIGN PATENT DOCUMENTS

| CN | 1453823 A | 11/2003 |
|---|---|---|
| JP | 63-048829 | 3/1988 |
| JP | 01-104761 | 4/1989 |

(Continued)

OTHER PUBLICATIONS

IBM Technical Disclosure Butletin, "Low Temperature Etching Mask", vol. 34, Issue 7A, p. 241 (Dec. 1991).*

(Continued)

*Primary Examiner* — John A McPherson
(74) *Attorney, Agent, or Firm* — Michael Best & Friedrich LLP

(57) ABSTRACT

Provided are a substrate with an etching mask which enables high definition patterning and a method of manufacturing the same. A photosensitive material is applied on a surface of a substrate, exposure and development of the photosensitive material are carried out to form a resist pattern, a DLC coating film is formed on the surface of the substrate and a surface of the resist pattern, and the DLC coating film formed on the resist pattern is separated together with the resist pattern to form a DLC pattern on the surface of the substrate.

14 Claims, 3 Drawing Sheets

(51) Int. Cl.
*H01L 21/033* (2006.01)
*H05K 3/06* (2006.01)

(56) References Cited

FOREIGN PATENT DOCUMENTS

| | | | |
|---|---|---|---|
| JP | H01-276138 | A | 11/1989 |
| JP | 05-036591 | | 2/1993 |
| JP | 05-279854 | | 10/1993 |
| JP | 10-255243 | | 9/1998 |
| JP | 2000-010300 | A * | 1/2000 |
| JP | 2001-068428 | | 3/2001 |
| JP | 2001-160547 | A | 6/2001 |
| JP | 2006-113498 | A | 4/2006 |
| JP | 2007-242596 | A | 9/2007 |
| JP | 2009-093170 | A | 4/2009 |
| JP | 2010-094807 | A | 4/2010 |
| JP | 2011-023052 | | 2/2011 |

OTHER PUBLICATIONS

IBM Technical Disclosure Butletin, "Method of Patterning Fine Line Features on Diamond Like Carbon Films", vol. 34, Issue 7A, pp. 313-314 (Dec. 1991).*
Computer-generated transaltion of JP 2000-010300 (Jan. 2000).*
International Preliminary Report on Patentability & Written Opinion issued Aug. 13, 2013 for corresponding PCT Application No. PCT/JP2012/052859.
International Search report issued Apr. 17, 2012 for corresponding International Application No. PCT/JP2012/052859.
Japanese Office Action issued Dec. 1, 2014 for corresponding Japanese Application No. 2011-026688.
Chinese Office Action issued Apr. 8, 2015 for corresponding Chinese Application No. 201280005495.6.
Japanese Office Action issued Apr. 30, 2015 for corresponding Japanese Application No. 2011-026688.

* cited by examiner

SUBSTRATE HAVING ETCHING MASK AND METHOD FOR PRODUCING SAME

TECHNICAL FIELD

The present invention relates to a substrate with an etching mask, which is patterned using diamond like carbon (DLC), and a method of manufacturing the same.

BACKGROUND ART

In manufacturing industrial products such as electronic components including a semiconductor component and a printed wiring board, high definition patterning is carried out by patterning an etching mask on a substrate and etching out regions other than a region of the etching mask (for example, Patent Documents 1 and 2).

The etching mask is formed by, for example, after a photosensitive layer is formed of a photosensitive material on a surface of a metal layer, carrying out exposure to form an exposed portion and a non-exposed portion in the photosensitive layer and carrying out development using difference in solubility in the developer between the exposed portion and the non-exposed portion.

However, in recent years, as electronic components become finer, higher definition patterning is required to be realized, and high definition patterning of the etching mask is required accordingly.

PRIOR ART DOCUMENTS

Patent Documents

Patent Document 1: JP 2001-160547 A
Patent Document 2: JP 2006-113498 A
Patent Document 3: JP 2009-093170 A

SUMMARY OF THE INVENTION

Problems to be Solved by the Invention

The present invention has been made in view of the above-mentioned problem of the conventional art, and an object of the present invention is to provide a substrate with an etching mask which enables high definition patterning and a method of manufacturing the same.

Means for Solving Problem

In order to solve the above-mentioned problems, according to the present invention, there is provided a substrate with an etching mask, characterized in that: a photosensitive material is applied on a surface of the substrate; exposure and development of the photosensitive material are carried out to form a resist pattern; a DLC coating film is formed on the surface of the substrate and a surface of the resist pattern; and the DLC coating film formed on the resist pattern is separated together with the resist pattern to form a DLC pattern on the surface of the substrate.

In this way, the DLC coating film formed on the resist pattern is separated together with the resist pattern, and thus, high definition patterning is possible. In other words, according to the present invention, a method of so-called lift-off is used, and thus, the problem of side etching does not arise, and, compared with a case in which a DLC pattern is formed by etching, higher definition patterning can be realized.

It is preferred that the substrate to which the photosensitive material is applied includes at least one material selected from the group consisting of Cu, Ag, Al, Au, Pt, Pd, Zn, Mg, Fe, stainless steel, Ni, Ni—Cr, Sn, Ti, Ti alloy, Si, $SiO_2$, glass, Cr, and Mo.

It is preferred that the substrate includes a cushion layer formed of a rubber or a resin having a cushioning property. In other words, the substrate may be formed on the cushion layer formed of a rubber or a resin having a cushioning property. As the cushion layer, a synthetic rubber such as a silicone rubber, or an elastic synthetic resin such as polyurethane or polystyrene can be used. As long as the cushion layer is thick enough to have the cushioning property, that is, resilience, the thickness of the cushion layer is not specially limited, and, for example, a thickness of about 1 cm to 5 cm is sufficient. Examples of the substrate including a cushion layer formed of a rubber or a resin having a cushioning property include the gravure plate described in Patent Document 3.

As the above-mentioned photosensitive material, any one of a positive photosensitive composition and a negative photosensitive composition is applicable, but the negative photosensitive composition is preferred.

It is preferred that a thickness of the DLC coating film be 0.1 μm to several tens of micrometers. Specifically, it is preferred that the thickness be 0.1 μm to 20 μm, more preferably 0.1 μm to 5 μm.

According to the present invention, there is provided a method of manufacturing a substrate with an etching mask, including the steps of preparing a substrate; applying a photosensitive material on a surface of the substrate; carrying out exposure and development of the photosensitive material to form a resist pattern; forming a DLC coating film on the surface of the substrate and a surface of the resist pattern; and separating the DLC coating film formed on the resist pattern together with the resist pattern.

It is preferred that the substrate to which the photosensitive material is applied includes at least one material selected from the group consisting of Cu, Ag, Al, Au, Pt, Pd, Zn, Mg, Fe, stainless steel, Ni, Ni—Cr, Sn, Ti, Ti alloy, Si, $SiO_2$, glass, Cr, and Mo.

It is preferred that the substrate include the above-mentioned cushion layer formed of a rubber or a resin having a cushioning property. In other words, the substrate may be formed on the cushion layer formed of a rubber or a resin having a cushioning property.

As the above-mentioned photosensitive material, any one of a positive photosensitive composition and a negative photosensitive composition is applicable, but the negative photosensitive composition is preferred.

It is preferred that a thickness of the DLC coating film be 0.1 μm to several tens of micrometers. Specifically, it is preferred that the thickness be 0.1 μm to 20 μm, more preferably 0.1 μm to 5 μm.

According to the present invention, there is provided an etching mask, characterized in that: a photosensitive material is applied on a surface of the substrate; exposure and development of the photosensitive material are carried out to form a resist pattern; a DLC coating film is formed on the surfaces of the substrate and a surface of the resist pattern; and the DLC coating film formed on the resist pattern is separated together with the resist pattern to form a DLC pattern on the surface of the substrate.

According to the present invention, there is provided a patterned product, characterized in that: a photosensitive material is applied on a surface of a substrate; exposure and development of the photosensitive material are carried out to form a resist pattern; a DLC coating film is formed on the surface of the substrate and a surface of the resist pattern; the DLC coating film formed on the resist pattern is separated together with the resist pattern to form a DLC pattern on the surface of the substrate; the substrate is etched; and the DLC pattern is removed by $O_2$ ashing treatment.

The patterned product according to the present invention is applicable as various patterned industrial products such as various electronic components including a semiconductor component and a printed wiring board.

According to the present invention, there is provided a method of manufacturing a patterned product, including: applying a photosensitive material on a surface of a substrate; carrying out exposure and development of the photosensitive material to form a resist pattern; forming a DLC coating film on the surface of the substrate and a surface of the resist pattern; separating the DLC coating film formed on the resist pattern together with the resist pattern to form a DLC pattern on the surface of the substrate; etching the substrate; and removing the DLC pattern by $O_2$ ashing treatment.

Effect of the Invention

The present invention may produce a great effect of providing the substrate with an etching mask which enables high definition patterning and the method of manufacturing the same.

BRIEF DESCRIPTION OF DRAWINGS

FIG. 1(a) is a sectional view of a principal part under a state in which a photosensitive material is applied to a surface of the substrate, FIG. 1(b) is a sectional view of a principal part under a state in which exposure and development of the photosensitive material are carried out to form a resist pattern, FIG. 1(c) is a sectional view of a principal part under a state in which a DLC coating film is formed on surfaces of the substrate and the resist pattern, FIG. 1(d) is a sectional view of a principal part under a state in which the DLC coating film formed on the resist pattern is separated together with the resist pattern, FIG. 1(e) is a sectional view of a principal part under a state in which the substrate is etched, and FIG. 1(f) is a sectional view of a principal part under a state in which the DLC pattern is removed by $O_2$ ashing treatment.

MODES FOR CARRYING OUT THE INVENTION

An embodiment of the present invention is described below, but the embodiment is merely an exemplary embodiment. It goes without saying that various modifications can be made thereto without departing from the technical concept of the present invention.

Figure 1:
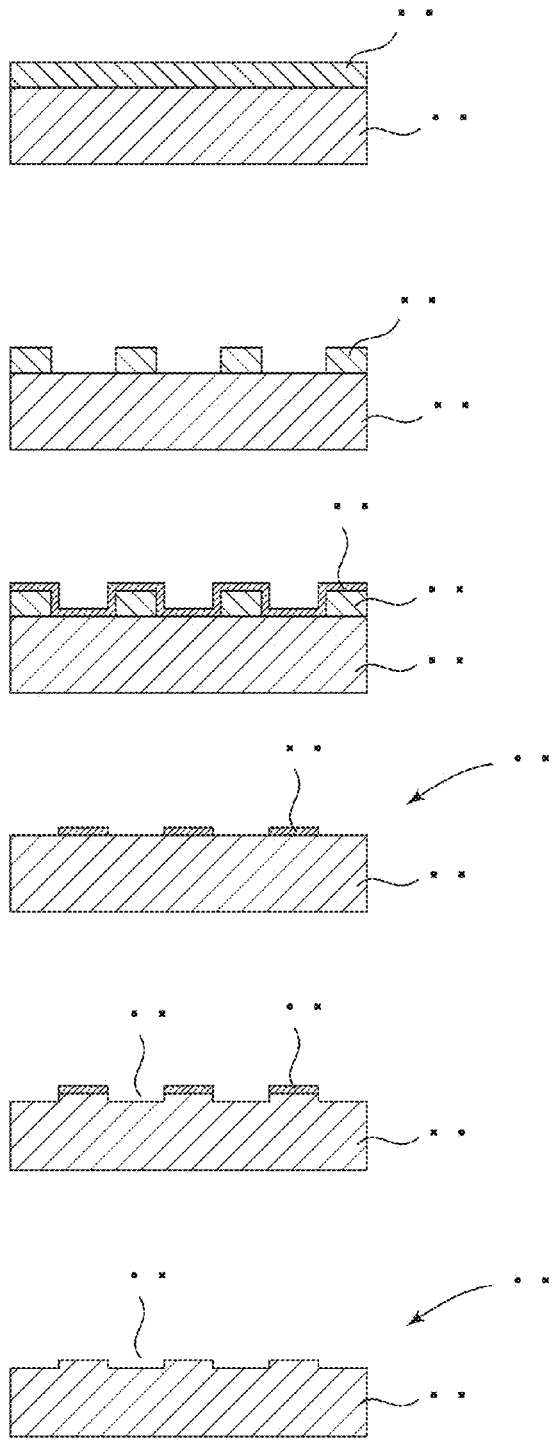
FIG. 1 are explanatory diagrams schematically illustrating an exemplary substrate with an etching mask and an exemplary patterned product according to the present invention.

In FIG. 1, reference numeral 10 represents a substrate with an etching mask. Reference numeral 12 represents a substrate, and the substrate includes at least one material selected from the group consisting of Cu, Ag, Al, Au, Pt, Pd, Zn, Mg, Fe, stainless steel, Ni, Ni—Cr, Sn, Ti, Ti alloy, Si, $SiO_2$, glass, Cr, and Mo.

Further, the substrate may include a cushion layer formed of a rubber or a resin having a cushioning property. In other words, the substrate may be formed on the cushion layer formed of a rubber or a resin having a cushioning property.

Figure 2:
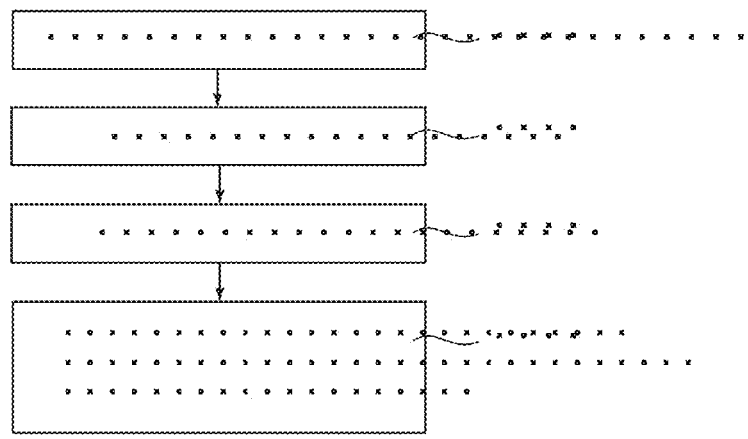
FIG. 2 is a flow chart illustrating a method of manufacturing the substrate with an etching mask illustrated in FIG. 1 in the order of the steps.

First, a photosensitive material 14 is applied to a surface of the substrate 12 (FIG. 1(a) and Step 100 in FIG. 2). Exposure and development of the photosensitive material are carried out to form a resist pattern 16 (FIG. 1(b) and Step 102 in FIG. 2). As the photosensitive material, any one of a negative photosensitive composition and a positive photosensitive composition can be used, but the negative photosensitive composition is preferred.

Then, a DLC coating film 18 is formed on surfaces of the substrate 12 and the resist pattern 16 (FIG. 1(c) and Step 104 in FIG. 2). The DLC coating film may be formed by chemical vapor deposition (CVD) or sputtering.

Next, the DLC coating film formed on the resist pattern is separated together with the resist pattern to form a DLC pattern 20 on the surface of the substrate (FIG. 1(d) and Step 106 in FIG. 2).

Figure 3:
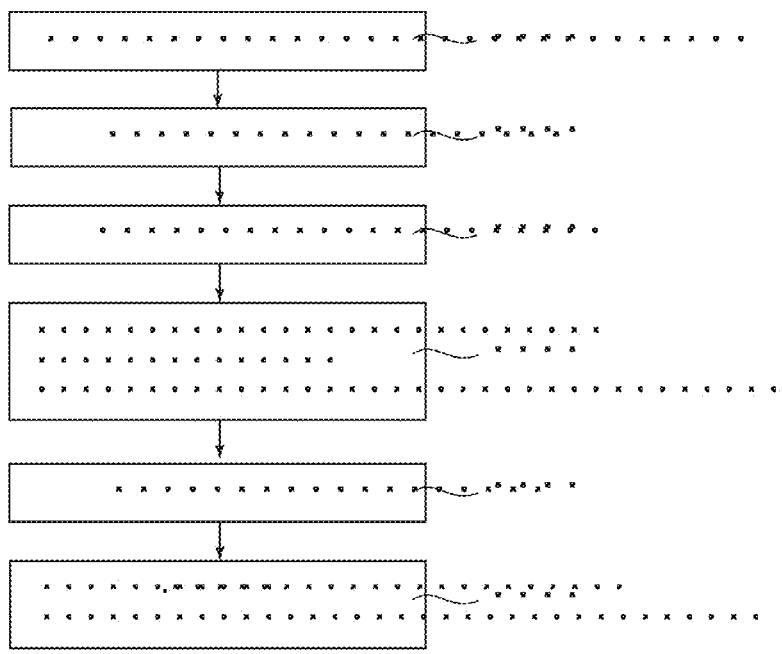
FIG. 3 is a flow chart illustrating a method of manufacturing the patterned product according to the present invention in the order of the steps.

In order to obtain a patterned product according to the present invention, after the above-mentioned Step 100 to Step 106, further, the substrate 12 is etched (FIGS. 1(e) and 108 in FIG. 3) to form a recessed pattern 22, and the DLC pattern is removed by $O_2$ ashing treatment (FIG. 1(f) and Step 110 in FIG. 3). Then, as the finishing, the surface of the substrate having the recessed pattern formed therein is polished to obtain a patterned product 24 according to the present invention.

EXAMPLE

The present invention is described more specifically by way of an example. It goes without saying that the example is merely an exemplary example and may not be construed as restrictive.

A plate substrate (aluminum hollow roll) having a circumference of 600 mm and a length of 1,100 mm was prepared. Boomerang Line (an automatic laser gravure plate making roll manufacturing equipment manufactured by THINK LABORATORY Co., Ltd.) was used to carry out the steps up to formation of a copper plating layer and a nickel plating layer described below. First, the plate substrate (aluminum hollow roll) was placed in a copper plating bath, and the entire hollow roll was immersed in a plating solution to form a copper plating layer of 80 μm at 20 A/dm² and 6.0 V. No rashes and pits were formed on the plated surface, and a uniform copper plating layer was obtained. The surface of the copper plating layer was polished by a four-head polisher (a polisher manufactured by THINK LABORATORY Co., Ltd.) to cause the surface of the copper plating layer to be a uniform polished surface. Then, the plate substrate was placed in a nickel plating bath, and was halfway immersed in a plating solution to form a nickel plating layer of 20 μm at 2 A/dm² and 7.0 V. No rashes and pits were formed on the plated surface, and a uniform nickel plating layer was obtained. With use of the above-mentioned formed nickel plating layer as the substrate, a photosensitive film (thermal resist: TSER-NS (manufactured by THINK LABORATORY Co., Ltd.)) was applied on the surface thereof (by a fountain coater), and drying was carried out. The thickness of the obtained photosensitive film measured by a film thickness gauge (F20 manufactured by Fillmetrics, Inc. and marketed by Matsushita Techno Trading Co., Ltd.) was 7 μm. Then, laser exposure was carried out and the image was developed. With regard to the above-mentioned laser exposure, Laser Stream FX was used and predetermined pattern exposure was carried out with the exposure condition of 300 mJ/cm². Further, with regard to the above-mentioned development, a TLD developer (a developer manufactured by THINK LABORATORY Co., Ltd.) was used with the developer dilution ratio of (undiluted solution: water=1:7) and the development was carried out at 24° C. for 90 seconds to form a predetermined resist pattern.

A DLC coating film was formed by CVD on the surfaces of the nickel plating layer and the resist pattern. An intermediate layer was formed to have a thickness of 0.1 μm in an atmosphere of argon/hydrogen gas using hexamethyldisiloxane as a material gas at a film formation temperature of 80 to 120° C. for a film formation time period of 60 minutes. Then, a DLC layer was formed to have a thickness of 5 μm using toluene as a material gas at a film formation temperature of 80 to 120° C. for a film formation time period of 180 minutes.

Then, the substrate was sonicated in a sodium hydroxide aqueous solution for 30 minutes. Then, the DLC coating film formed on the resist pattern was separated together with the resist pattern to obtain a substrate with an etching mask, which has the DLC pattern formed on the surface of the substrate.

Figure 4:
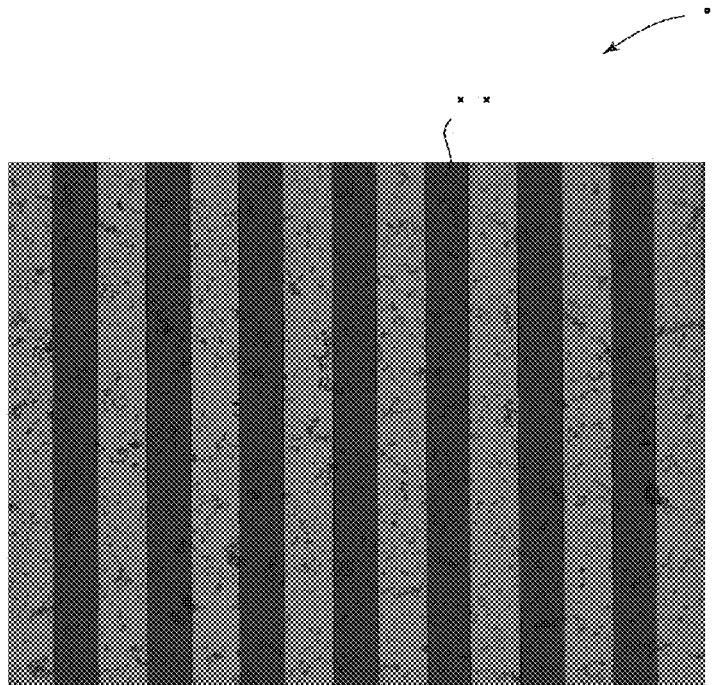
FIG. 4 is an enlarged picture of a surface of a substrate with an etching mask according to an example.

The surface of the substrate with an etching mask was observed under an optical microscope. A substrate with a high definition etching mask shown in FIG. 4 was observed. In FIG. 4, the line width of the DLC pattern 20 was 10 μm.

Then, an etchant of nitric acid (5%)+hydrogen peroxide (5%) was applied to the substrate with an etching mask by spraying to etch the nickel layer which was the substrate.

Figure 5:
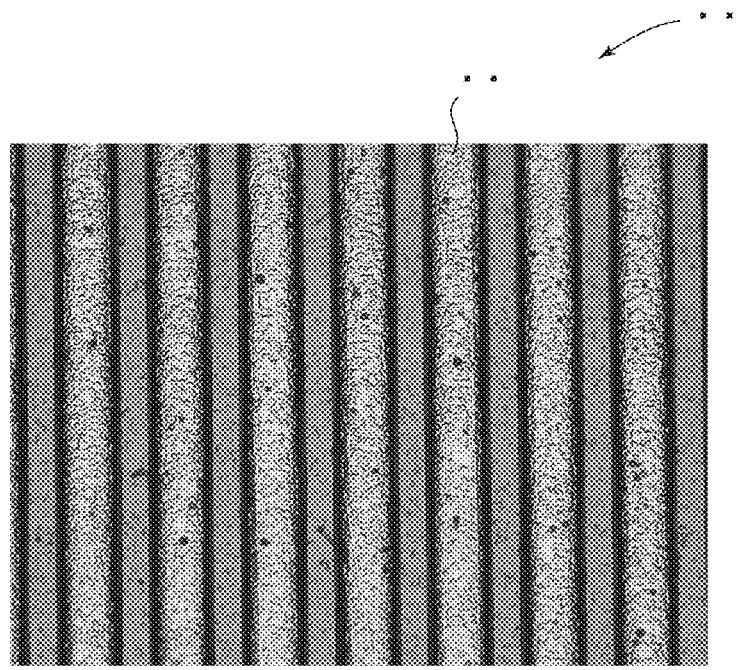
FIG. 5 is an enlarged picture of a surface of a patterned product according to the example.

Then, the substrate with an etching mask after the nickel layer thereof was etched was moved into a treatment chamber, and O₂ ashing treatment was carried out with respect to the DLC pattern 20 to remove the DLC pattern 20. The surface of the nickel layer having the recessed pattern 22 formed therein was polished using the four-head polisher (a polisher manufactured by THINK LABORATORY Co., Ltd.) to obtain a high definition patterned product shown in FIG. 5. With reference to FIG. 5, the surface of the patterned product observed under an optical microscope had a line width and a depth of the recessed pattern 22 of 14 μm and 5 μm, respectively.

Further, substrates with etching masks were manufactured similarly to the above-mentioned example using Ni also with regard to cases in which Cu, Ag, Al, Au, Pt, Pd, Zn, Mg, Fe, stainless steel, Ni—Cr, Sn, Ti, Ti alloy, Si, SiO₂, glass, Cr, and Mo, respectively, were used as the substrate. The surfaces of these substrates with etching masks were observed under an optical microscope. Substrates with high definition etching masks were observed.

Further, a substrate with an etching mask was manufactured similarly to the above-mentioned example using Ni except that, as the substrate, a roll in which a nickel sleeve having a thickness of 0.4 mm was fitted on a silicone rubber was used. Specifically, a substrate including a cushion layer formed of a silicone rubber was used to manufacture a substrate with an etching mask similarly to the example. The obtained substrate with an etching mask was observed under an electron microscope. A high definition DLC pattern was observed.

REFERENCE SIGNS LIST

10: substrate with etching mask, 12: substrate, 14: photosensitive material, 16: resist pattern, 18: DLC coating film, 20: DLC pattern, 22: recessed pattern, 24: patterned product.

The invention claimed is:

1. A substrate with an etching mask, which is manufactured by using an automatic laser gravure plate making roll manufacturing equipment, characterized in that:
    a photosensitive material is applied on a surface of a hollow roll-like substrate;
    exposure and development of the photosensitive material are carried out to form a resist pattern covering a portion the surface of the hollow roll-like substrate while a remaining portion of the surface of the substrate is uncovered;
    a continuous, single-layer DLC coating film is applied onto the resist pattern and the remaining portion of the surface of the substrate such that one portion of the continuous, single-layer DLC coating film is in facial contact with and covers the resist pattern to define a resist DLC coating film portion and a remaining portion of the continuous, single-layer DLC coating film is in facial contact with and covers the remaining portion of the surface of the substrate to define a substrate DLC coating film portion; and
    the resist pattern and the resist DLC coating film portion are removed from the surface of the substrate while the substrate DLC coating film portion remains in facial contact with and covers the remaining portion of the surface of the substrate.

2. A substrate with an etching mask according to claim 1, wherein the substrate to which the photosensitive material is applied comprises at least one material selected from the group consisting of Cu, Ag, Al, Au, Pt, Pd, Zn, Mg, Fe, stainless steel, Ni, Ni—Cr, Sn, Ti, Ti alloy, Si, SiO₂, glass, Cr, and Mo.

3. A substrate with an etching mask according to claim 1, wherein the substrate comprises a cushion layer formed of a rubber or a resin having a cushioning property.

4. A substrate with an etching mask according to claim 1, wherein the photosensitive material comprises a negative photosensitive composition.

5. A substrate with an etching mask according to claim 1, wherein a thickness of the DLC coating film is 0.1 μm to several tens of micrometers.

6. A product, characterized by being manufactured using the substrate with an etching mask according to claim 1.

7. A method of manufacturing a substrate with an etching mask, which is manufactured by using an automatic laser gravure plate making roll manufacturing equipment, comprising the steps of:
    preparing a hollow roll-like substrate;
    applying a photosensitive material on a surface of the hollow roll-like substrate;
    carrying out exposure and development of the photosensitive material to form a resist pattern covering a portion the surface of the substrate while a remaining portion of the surface of the substrate is uncovered;
    applying a continuous, single-layer DLC coating film onto the resist pattern and the remaining portion of the surface of the substrate such that one portion of the continuous, single-layer DLC coating film is in facial contact with and covers the resist pattern to define a resist DLC coating film portion and a remaining portion of the continuous, single-layer DLC coating film is in facial contact with and covers the remaining portion of the surface of the substrate to define a substrate DLC coating film portion; and
    removing the resist pattern and the resist DLC coating film portion from the surface of the substrate while the substrate DLC coating film portion remains in facial contact with and covers the remaining portion of the surface of the substrate.

8. A method of manufacturing a substrate with an etching mask according to claim 7, wherein the substrate to which the photosensitive material is applied comprises at least one material selected from the group consisting of Cu, Ag, Al, Au, Pt, Pd, Zn, Mg, Fe, stainless steel, Ni, Ni—Cr, Sn, Ti, Ti alloy, Si, $SiO_2$, glass, Cr, and Mo.

9. A method of manufacturing a substrate with an etching mask according to claim 7, wherein the substrate comprises a cushion layer formed of a rubber or a resin having a cushioning property.

10. A method of manufacturing a substrate with an etching mask according to claim 7, wherein the photosensitive material comprises a negative photosensitive composition.

11. A method of manufacturing a substrate with an etching mask according to claim 7, wherein a thickness of the DLC coating film is 0.1 µm to several tens of micrometers.

12. An etching mask, which is manufactured by using an automatic laser gravure plate making roll manufacturing equipment, characterized in that:
  a photosensitive material is applied on a surface of a hollow roll-like substrate;
  exposure and development of the photosensitive material are carried out to form a resist pattern covering a portion the surface of the substrate while a remaining portion of the surface of the substrate is uncovered;
  a DLC coating film is applied onto the surface of the substrate and a surface of the resist pattern forming a resist DLC coating film in facial contact with the resist pattern and a substrate DLC coating film in facial contact with the remaining portion of the surface of the substrate; and
  the resist pattern and the resist DLC coating film in facial contact with and on the resist pattern are removed from the surface of the substrate while the substrate DLC coating film in facial contact with the remaining portion of the surface of the substrate remaining in facial contact therewith.

13. A patterned product, which is manufactured by using an automatic laser gravure plate making roll manufacturing equipment, characterized in that:
  a photosensitive material is applied on a surface of a hollow roll-like substrate;
  exposure and development of the photosensitive material are carried out to form a resist pattern covering a portion the surface of the substrate while a remaining portion of the surface of the substrate is uncovered;
  a continuous, single-layer DLC coating film is applied onto the resist pattern and the remaining portion of the surface of the substrate such that one portion of the continuous, single-layer DLC coating film is in facial contact with and covers the resist pattern to define a resist DLC coating film portion and a remaining portion of the continuous, single-layer DLC coating film is in facial contact with and covers the remaining portion of the surface of the substrate to define a substrate DLC coating film portion;
  the resist DLC coating film portion in facial contact with and formed on the resist pattern is separated together with the resist pattern while the substrate DLC coating film portion on the surface of the substrate remains in facial contact with the remaining portion of the surface of the substrate;
  the substrate is etched; and
  the substrate DLC coating film portion is removed by $O_2$ ashing treatment.

14. A method of manufacturing a patterned product, which is manufactured by using an automatic laser gravure plate making roll manufacturing equipment, comprising:
  applying a photosensitive material on a surface of a hollow roll-like substrate;
  carrying out exposure and development of the photosensitive material to form a resist pattern covering a portion the surface of the substrate while a remaining portion of the surface of the substrate is uncovered;
  applying a continuous, single-layer DLC coating film on the resist pattern and the remaining portion of the surface of the substrate such that one portion of the continuous, single-layer DLC coating film is in facial contact with and covers the resist pattern to define a resist DLC coating film portion and a remaining portion of the continuous, single-layer DLC coating film is in facial contact with and covers the remaining portion of the surface of the substrate to define a substrate DLC coating film portion;
  separating the resist DLC coating film portion in facial contact with and formed on the resist pattern together with the resist pattern while retaining the substrate DLC coating film portion on the surface of the substrate;
  etching the substrate; and
  removing the substrate DLC coating film portion by $O_2$ ashing treatment.

* * * * *